United States Patent [19]

Sheahan et al.

[11] Patent Number: 5,805,001
[45] Date of Patent: Sep. 8, 1998

[54] ZERO PHASE CIRCUIT FOR SAMPLED DATA PHASE LOCKED LOOP

[75] Inventors: Benjamin Joseph Sheahan; Richard Charles Pierson, both of Dallas, Tex.

[73] Assignee: Texas Instruments Instruments Incorporated, Dallas, Tex.

[21] Appl. No.: 665,145

[22] Filed: Jun. 13, 1996

[51] Int. Cl.⁶ ........................................................ H03L 7/00
[52] U.S. Cl. .............................. 327/142; 327/95; 327/97; 327/79; 327/198
[58] Field of Search ................................. 327/78, 79, 91, 327/94, 95, 96, 97, 142, 198

[56] References Cited

U.S. PATENT DOCUMENTS 5,399,964  3/1995  Zoller ........................................ 327/94

Primary Examiner—Terry Cunningham
Assistant Examiner—Kenneth B. Wells
Attorney, Agent, or Firm—Bret J. Petersen; W. Daniel Swayze, Jr.; Richard L. Donaldson

[57] ABSTRACT

A circuit provides a restart signal to indicate a zero crossing of a continuous varying signal. A zero phase signal is generalized based on a zero crossing of the continuous varying signal. The continuous varying signal is sampled and held in accordance with the zero crossing. The continuous varying signal is converted to complementary signals, and these complementary signals are in turn converted to a signal appropriate for CMOS circuits.

4 Claims, 2 Drawing Sheets

ZERO PHASE CIRCUIT FOR SAMPLED DATA PHASE LOCKED LOOP

TECHNICAL FIELD OF THE INVENTION

This invention relates to read channel devices, more particularly to a device to synchronize to a read signal from a hard disk drive read head.

BACKGROUND OF THE INVENTION

A typical disk includes a series of tracks or channels which are concentrically arranged. These tracks are written and read by a head which senses the information stored on the disks. This information may include format information, as well as, user information. When this information is read by the head it is transferred to various circuits for interpretation. This circuitry may be known as a read channel circuit.

In attempting to design read channel devices to read, for example, hard disk drives, many designs have been presented in order to achieve high area density on the hard disk drive while maintaining the synchronization necessary to read every data area located on the hard disk drive.

FIG. 1 illustrates typical information loaded onto a hard disk drive in order to achieve the proper synchronization with each of the data areas. The information required for such synchronization includes a preamble 100 necessary to achieve the synchronization. The ID field 102 is used to identify the particular data sector while the digital acquisition field may be used to acquire the correct phase. However, the use of such a format introduces a significant overhead in the actual data stored.

The data stored and used by the user will be significantly reduced by the digital acquisition phase synchronization preamble required for the read operation. Thus, if these fields could be made smaller or eliminated entirely the data field containing the actual user data could be increased.

One solution to this problem has been the use of partial response maximum likelihood (PRML) to achieve high area density on hard disk drives. Typically, a PRML channel gains about 30–40 percent more storage capacity than a conventional peak-detection channel.

FIG. 2 illustrates a typical hard disk drive system including the analog front end signal processor and a companion digital ASIC. The analog read signal goes through an automatic gain control (AGC) and filter path and the filter is synchronously sampled by the A/D converter (ADC) which is clocked by the synchronizer SNC phase lock loop PLL. The digitized samples are input to the digital chip where it is further processed by a finite-impulse-response FIR digital filter which equalizes the signal to a PR4 partial response spectrum shape. The signal is finally passed through a Viterbi detector which performs a maximum likelihood sequence detection. The digital read data is then output.

SUMMARY OF THE INVENTION

The present invention reduces the overhead associated with the information located on a disk. The present invention provides a reduction of the digital acquisition field thereby increasing the area available for user data, while determining both the correct frequency and the correct phase in order to successfully perform a read operation. The present invention reads data from a hard disk drive with an extremely low error rate. The present invention provides a zero phase restart so that the synchronization phase lock loop clock will sample the read signal at the correct phase. Additionally, the present invention provides a sample and hold circuit that samples the filtered and equalized read signal at the correct phase. The present invention determines when a signal crosses zero in which to start the phase lock loop. The present invention samples and stores read signal at a very precise phase delay after the signal crosses zero. This phase delay corresponds to the particular frequency being used and is independent of process and temperature variations. The present invention provides a circuit which has a time delay less than 4.5 nano seconds between the output of the VCO and the input to a second sample on hold circuit. The time delay may not exceed ½ the period of the highest frequency clock signal.

The present invention eliminates phase error and consequently eliminates the need to correct for this phase error when reading the hard drive.

DETAILED DESCRIPTION OF THE DRAWINGS

DETAILED DESCRIPTION OF THE INVENTION

Figure 3:
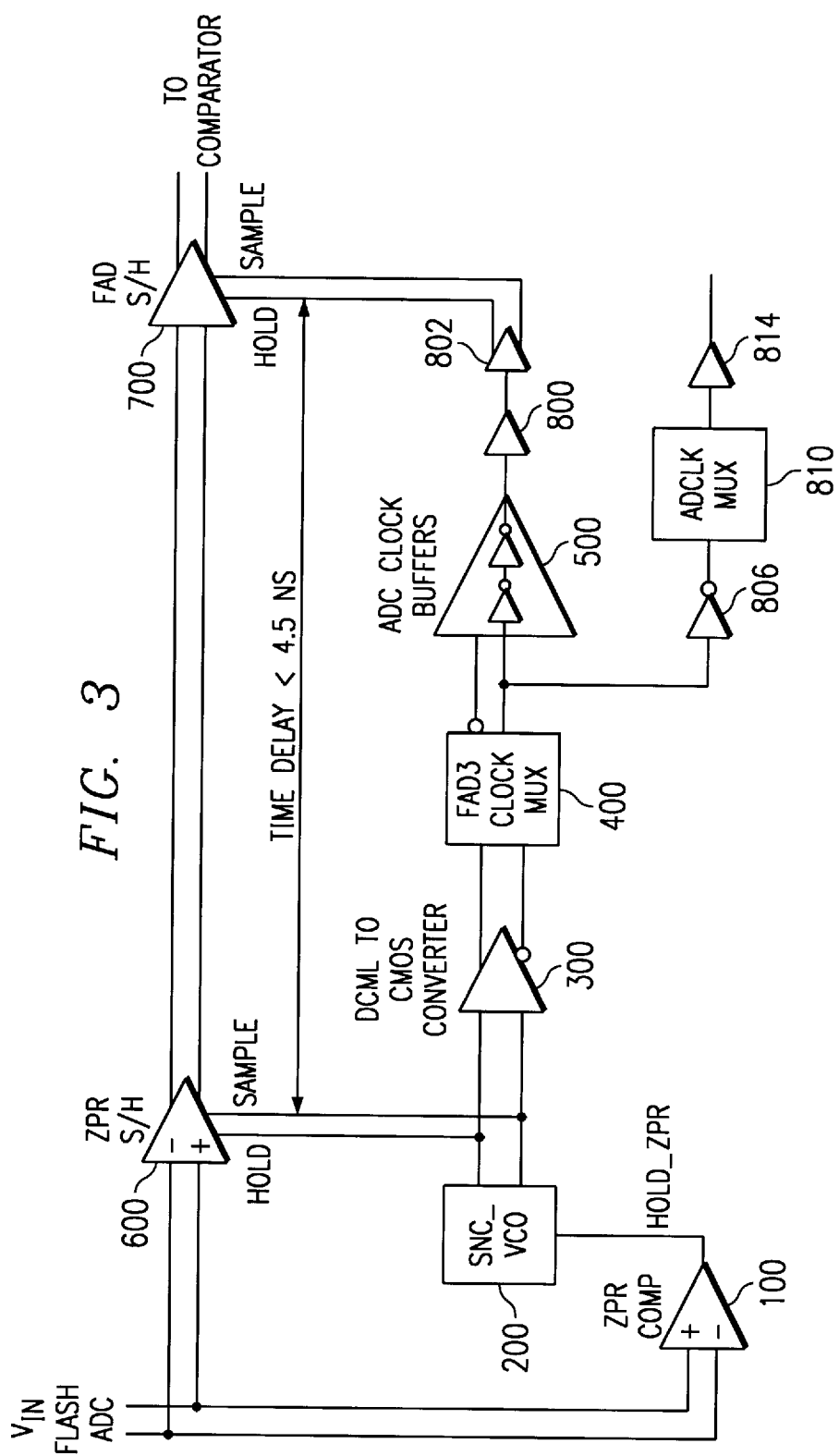
FIG. 3 illustrates an overall diagram of the present invention.

The present invention includes a circuit for providing a restart signal to indicate a zero crossing of a continuous varying signal including a zero phase circuit to receive the continuous varying signal and to output a zero phase signal based on a zero crossing of the continuous varying signal, a voltage control circuit coupled to said zero phase circuit to output a first and second complementary signal based on said zero phase circuit, a first sample and hold circuit to sample and hold said continuous varying signal in accordance with a control signal output from said voltage control circuit, a converter circuit to convert the first and second complementary signals to CMOS signals to operate a CMOS circuit, a second sample and hold circuit to sample and hold an output of the first sample and hold circuit in accordance with a second control signal output from the CMOS circuit As illustrated in FIG. 3, zero phase restart comparator 100 detects a zero crossing of the amplified, filtered and equalized read signal, and in response to this zero crossing outputs a signal to the synchronizer voltage controlled oscillator (SNC VCO) 200. This signal may be a logical one. The SNC VCO outputs a differential current mode logic (DCML) signal to the zero phase restart sample and hold circuit 600 and the DCML to CMOS converter 300. The DCML to CMOS convertor level shifts and amplifies the differential signal from the SNC VCO 200 and outputs a pair of complementary CMOS signals which are 5 volts in amplitude. These signals are transmitted to the FAD3 clock MUX 400 which in turn outputs the clock to the ADC clock buffer 500. The Output of the syc SNC VCO is a 2.4V fully differential peak to peak signal which is referenced to plus 5 volt power supply. This signal should be level shifted to a common mode voltage of 1 volt reference to ground potential of the circuit.

Figure 1:
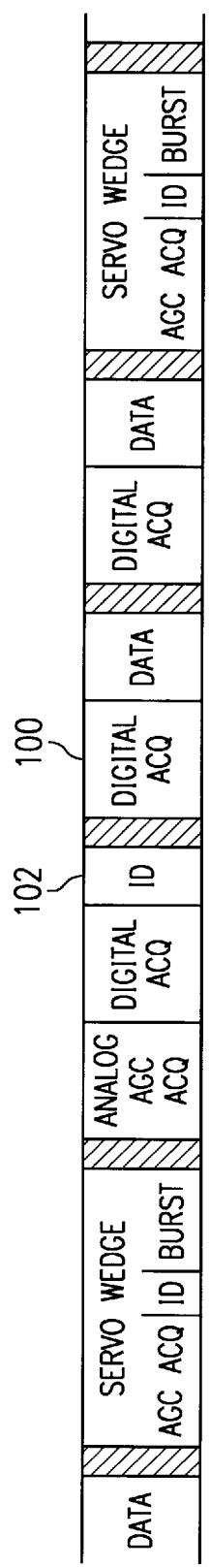
FIG. 1 illustrates a channel for a disk.
Figure 2:
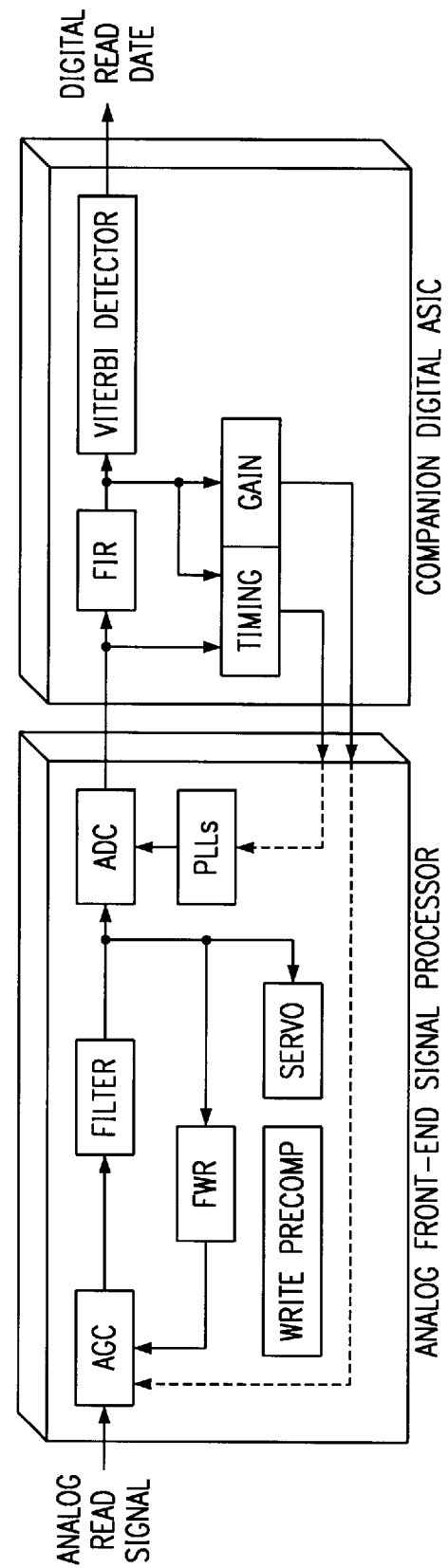
FIG. 2 illustrates a read channel device of the present invention.

The read signal $V_{IN}$ has been amplified, filtered and equalized by the AGC and filter respectively(as shown in FIG. 1). The signal $V_{IN}$ is a continuous time analog signal. The $V_{IN}$ is input to zero phase comparator 100 The zero phase comparator 100 outputs a logical 1 signal, for example, a HOLD ZPR signal which is input to the SNC VCO 200. Additionally, $V_{IN}$ is input to the zero phase restart sample and hold circuit 600, which is controlled by the sample and hold signals from the SNC VCO. The zero phase restart sample and hold 600 samples $V_{IN}$ when the sample control signal is active high and holds the sampled read signal from when the hold control signal is active high. The phase lock loop is started at a known time. And, because the delay has been defined, the analog signal is sampled at the correct time. This correct time is 45 degrees from when the signal has crossed zero. The DCML to CMOS converter 300 converts the differential VCO output clock signal to complementary 5 volt signals which are appropriate to use in CMOS circuits. The converter 300 converts the two input signals and outputs a combined signal based on these input signals. The clock MUX circuit 400 selects the signals such that when two clocks are switched no partial pulses are generated. The different clocks may be selected from either the reference clock or the clocks from the SNC PLL in order to sample different types of data recorded on the disk At a delay of less than a half of clock cycle, for example, less than 4.590 nano seconds when the clock is a 90 megahertz clock, the sample and hold circuit 700 samples the output of the zero phase restart sample and hold circuit 600 when it is holding the sampled read signal.

What is claimed is:

1. A circuit for providing a restart signal to indicate a zero crossing of a continuous varying signal, comprising:

a zero phase circuit to receive said continuous varying signal and to output a zero phase signal based on a zero crossing of said continuous varying signal;

a voltage control circuit coupled to said zero phase circuit to output complementary control signals based on an output of said zero phase circuit;

a first sample and hold circuit to sample and hold said continuous varying signal in accordance with said complementary control signals output from said voltage control circuit;

a converter circuit to convert said complementary control signals to a CMOS signal;

a CMOS circuit responsive to said converter circuit CMOS signal to output a control signal;

a second sample and hold circuit to sample and hold after a first delay an output of said first sample and hold circuit in accordance with said control signal output from said CMOS circuit.

2. A circuit for providing a restart signal to indicate a zero crossing of a continuous varying signal as in claim 1, wherein said continuously varying signal has a frequency, and said circuit provides a delay less than the inverse of ¼ of said frequency.

3. A circuit for providing a restart signal to indicate a zero crossing of a continuous varying signal as in claim 1, wherein said delay is less than 4.5 nano seconds.

4. A circuit for providing a restart signal to indicate a zero crossing of a continuous varying signal as in claim 1, wherein a second delay between said voltage control circuit and said CMOS circuit is less than 1.2 nano seconds.

* * * * *

UNITED STATES PATENT AND TRADEMARK OFFICE
CERTIFICATE OF CORRECTION

PATENT NO. : 5,805,001
DATED : Sep. 8, 1998
INVENTOR(S) : Benjamin Joseph Sheahan; Richard Charles Pierson, both of Dallas, Tex.

It is certified that error appears in the above-identified patent and that said Letters Patent is hereby corrected as shown below:

In the face of the patent please change the assignee from "Texas Instruments Instruments Incorporated" to Texas Instruments Incorporated.

Signed and Sealed this

Twenty-third Day of March, 1999

Attest:

Q. TODD DICKINSON

Attesting Officer

Acting Commissioner of Patents and Trademarks